United States Patent [19]

Kakizaki et al.

[11] Patent Number: 4,537,501

[45] Date of Patent: Aug. 27, 1985

[54] APPARATUS FOR THE ATTITUDE CONTROL OF PLATE-FORM BODY

[75] Inventors: Yukio Kakizaki, Yokohama; Hisao Izawa; Junji Hazama, both of Kawasaki, all of Japan

[73] Assignee: Nippon Kogaku K.K., Tokyo, Japan

[21] Appl. No.: 581,049

[22] Filed: Feb. 17, 1984

[30] Foreign Application Priority Data

Feb. 22, 1983 [JP] Japan .................................. 58-28336

[51] Int. Cl.³ ........................ G03B 27/62; G03B 27/64
[52] U.S. Cl. ...................................... 355/76; 355/53; 355/73
[58] Field of Search ...................... 355/45, 53, 54, 73, 355/76, 78, 79, 87, 95

[56] References Cited

U.S. PATENT DOCUMENTS

| 3,645,622 | 2/1972 | Cachon et al. | 355/78 X |
| 3,950,095 | 4/1976 | Bouygues et al. | 355/53 X |
| 4,084,903 | 4/1978 | Pircher | 355/53 |
| 4,093,378 | 6/1978 | Horr et al. | 355/76 |
| 4,189,230 | 2/1980 | Zasio | 355/76 |
| 4,239,381 | 12/1980 | Lacombat et al. | 355/53 |
| 4,315,692 | 2/1982 | Heinecke et al. | 355/76 X |
| 4,345,836 | 8/1982 | Phillips | 355/53 |
| 4,422,754 | 12/1983 | Isohata et al. | 355/76 X |
| 4,441,808 | 4/1984 | Giacomelli | 355/73 X |
| 4,477,183 | 10/1984 | Kawamura et al. | 355/53 X |

Primary Examiner—Richard A. Wintercorn
Attorney, Agent, or Firm—Shapiro and Shapiro

[57] ABSTRACT

An apparatus for the attitude control of a plate-form body such as mask or wafer comprises a supporting table, a first movable stage placed on the table and a second movable stage placed on the first stage. The second movable stage is provided means for holding the plate-form body on a reference plane containing the origin of the coordinates defined by two orthogonal coordinate axes. Between the supporting table and the first movable stage there is disposed first driving means. The first driving means is disposed for displacing the first movable stage at at least two positions opposed to each other relative to one of the coordinate axes. The displacement is produced in the direction substantially normal to a segment passing through the origin of the coordinates and forming a determined angle with the reference plane. The displacement of the first stage relative to the table in the direction substantially normal to the above direction is inhibited by first limiting means. Similarly second driving means is disposed between the first and second movable stages for producing the displacement of the second stage at at least two positions opposed to each other relative to the other coordinate axis. The displacement produced by second driving means is in the direction substantially normal to a segment passing through the origin of the coordinates and forming a determined angle with the reference plane. Second limiting means is provided to inhibit the displacement of the second movable stage in the direction substantially normal to the above direction of displacement by the second driving means.

10 Claims, 8 Drawing Figures

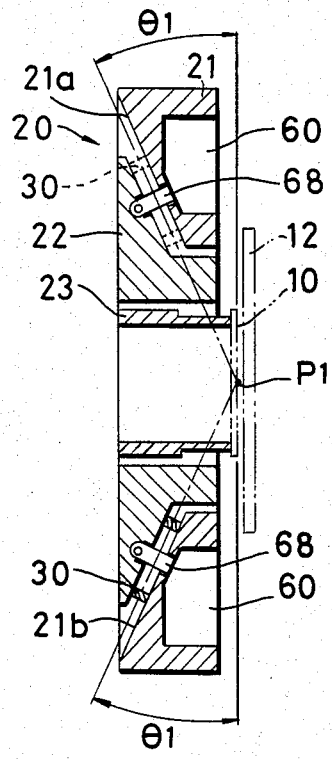
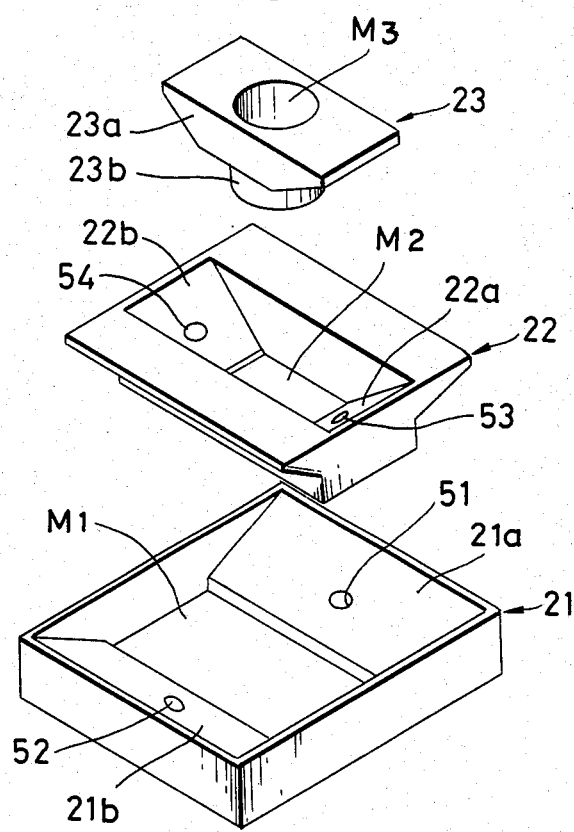
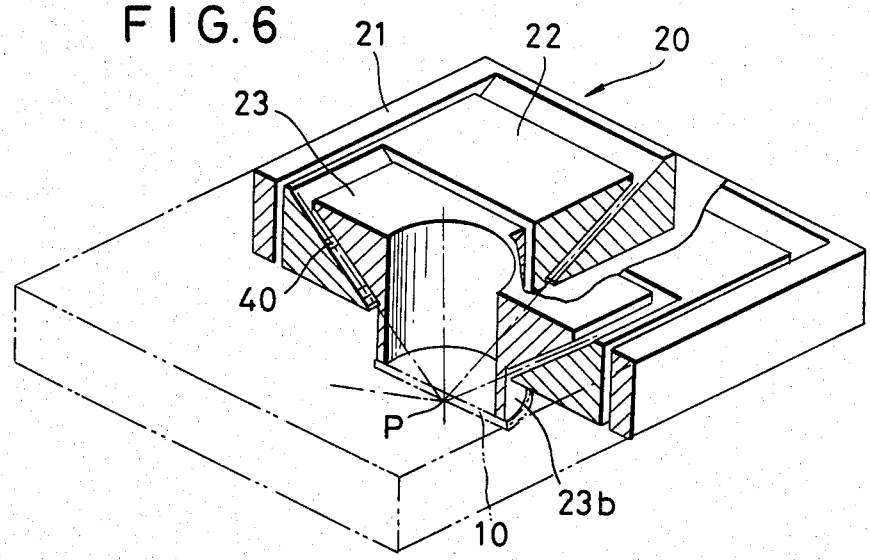

APPARATUS FOR THE ATTITUDE CONTROL OF PLATE-FORM BODY

BACKGROUND OF THE INVENTION

1. Field of the Invention

The present invention relates to apparatus for the attitude control of a plate-form body. More particularly, the present invention relates to the attitude control apparatus of wafer or mask used for the precision alignment of a photo mask with a semiconductor substrate surface in making semiconductor elements.

2. Description of the Prior Art

In making semiconductor elements a pattern on a photo mask is printed on a wafer by use of an exposure apparatus. As a kind of such exposure apparatus there is known the so-called proximity exposure apparatus in which the photo mask and the wafer are held in close proximity to each other. In the case of proximity exposure apparatus a particularly high precision is required in the alignment of mask with wafer. Man has to carry out an alignment work before every exposure. In brief, the alignment work involves the following operations:

(1) To align the alignment mark on the mask with the alignment mark on the wafer. At this step of operation, mask and/or wafer must be moved in the directions of X-Y axes and also rotated in the direction of $\theta$.

(2) To bring the mask and wafer into the positions in parallel with each other. For this operation the mask and/or wafer are required to be inclinable in any direction without losing the alignment of the alignment marks obtained at (1). In order to keep the established alignment of the alignment marks, the displacement of mask and/or wafer in X-Y directions must be minimized at this step of operation (2).

(3) To adjust the gap size between mask and wafer to a predetermined value. For this operation the mask and/or wafer are required to be movable in the fashion of parallel displacement in the direction of Z-axis perpendicular to the plane containing X-Y axes.

When a proximity exposure apparatus is used, the alignment operations described above are required in principle. The adjustments of parallelism and gap size between mask and wafer are very important in particular when an X-ray exposure apparatus is used. In the X-ray exposure apparatus X-rays are emitted toward a definite size of target and a mask pattern is exposed onto a wafer by the X-rays. In this case, the alignment accuracy in X-Y directions is greatly affected by the error in adjustment of gap size between mask and wafer. Therefore, the gap size as well as the parallelism between mask and wafer should be controlled very very precisely.

These requirements may be satisfied by uniting two mechanisms, for example, for above operations (1) and (2) together. However, it will render the structure of the apparatus very complicated as a whole.

SUMMARY OF THE INVENTION

Accordingly, it is an object of the invention to provide apparatus for the attitude control of a plate-form body such as mask or wafer which enables to carry out the operation for parallel displacement and the operation for inclination by one and same mechanism.

It is another object of the invention to provide such attitude control apparatus by which the lateral displacement of the center of inclination in any direction can be reduced to a practically negligible amount during the operation for inclination of mask or wafer.

To attain the objects the apparatus according to the invention comprises a supporting table, a first movable stage placed on the table and a second movable stage placed on the first stage. The second movable stage is provided means for holding the plate-form body on a reference plane containing the origin of the coordinates defined by two orthogonal coordinate axes. Between the supporting table and the first movable stage there is disposed first driving means. Said first driving means is disposed for displacing the first movable stage at at least two positions opposed to each other relative to one of the coordinate axes. The displacement is produced in the direction substantially normal to a segment passing through the origin of the coordinates and forming a determined angle with the reference plane. The displacement of the first stage relative to the table in the direction substantially normal to the above direction is inhibited by first limiting means. Similarly second driving means is disposed between the first and second movable stages for producing the displacement of the second stage at at least two positions opposed to each other relative to the other coordinate axis. The displacement produced by second driving means is in the direction substantially normal to a segment passing through the origin of the coordinates and forming a determined angle with the reference plane. Second limiting means is provided to inhibit the displacement of the second movable stage in the direction substantially normal to the above direction of displacement by said second driving means.

Other objects, features and advantages of the present invention will appear more fully from the following description taken in connection with the accompanying drawings.

BRIEF DESCRIPTION OF THE DRAWINGS

FIG. 4 is a sectional view taken along the line IV—IV and looking in the direction of arrow in FIG. 2;

FIG. 5 is an exploded perspective view of the supporting table and the first and second movable stages;

FIG. 6 is a partly sectional perspective view showing the respective elements of the apparatus shown in FIG. 2 with the driving systems being omitted;

DESCRIPTION OF PREFERRED EMBODIMENTS

Figure 1:
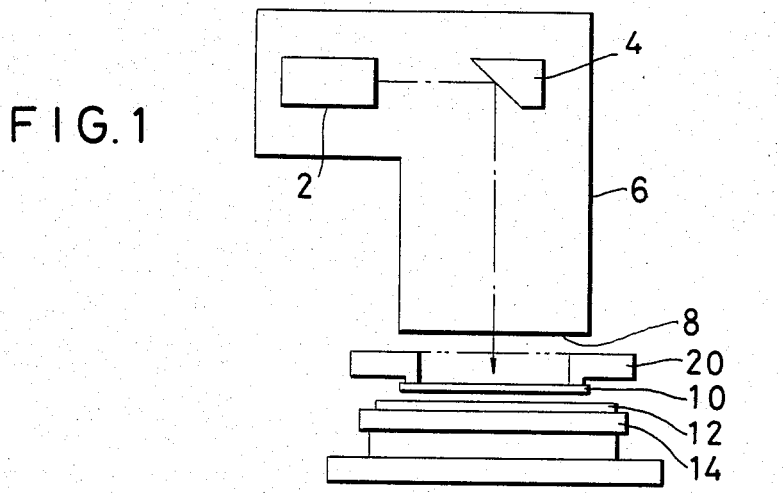
FIG. 1 is a schematical view of an X-ray exposure apparatus showing an embodiment of the present invention.

Referring first to FIG. 1 there is shown an X-ray exposure apparatus in which the present invention has been embodied.

The exposure apparatus includes an electron gun 2 and a target 4 enclosed in a vacuum chamber 6. The electron gun 2 emits soft X-rays which come out of the chamber 6 through a window 8 and then run in the air toward a photo mask 10. The photo mask has a pattern formed thereon. An image of the pattern is printed on the surface of a wafer 12 by the soft X-rays.

The wafer 12 is placed on a wafer stage 14 which is movable in the directions of X, Y, Z and θ for the alignment of the wafer with the photo mask. 20 is an attitude control apparatus with a mask holder which holds the photo mask 10 by suction. The apparatus 20 controls the attitude of the mask in order to keep the mask parallel to the wafer. The detailed structure of the attitude control apparatus 20 is shown in FIGS. 2 to 6.

Figure 2:
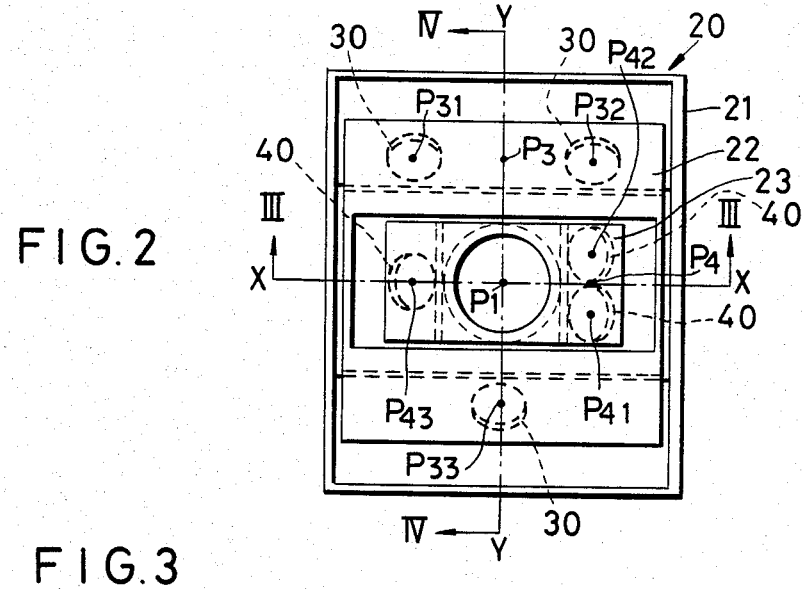
FIG. 2 is a plan view of the attitude control apparatus of the embodiment.

FIG. 2 is a plan view of the control apparatus 20.

In FIG. 2, X—X axis and Y—Y axis correspond to X-axis and Y-axis of coordinates respectively. The coordinate axes X and Y intersect at the center point P1 lying in a plane containing the coordinates axes X and Y.

Designated by 21 is a supporting table which is fixed to the main body of the exposure apparatus or movably mounted for relative movement to the main body in the directions of the coordinate axes X and Y. As seen best in FIG. 5, the supporting table 21 comprises a rectangular frame member having a pair of inclined surfaces 21a, 21b and a rectangular central opening M1. The surfaces 21a and 21b are disposed symmetrically relative to X—X axis and both of the surfaces are inclined toward the coordinate axis X.

Designated by 22 is a first movable stage formed as a rectangular frame member. The frame member has on its backside inclined surfaces corresponding to the above-mentioned inclined surfaces 21a and 21b of the table 21. On the upper side, the first stage 22 has also a pair of inclined surfaces 22a and 22b which are disposed symmetrically relative to the Y—Y axis and inclined toward the coordinate axis Y. At the middle, the first stage has also a rectangular opening $M_2$. As seen best in FIG. 4, one or two springs 30 are disposed in the space between the inclined surfaces 21a, 21b of the table 21 and the inclined backside surfaces of the first movable stage 22. Both ends of each the spring 30 are fixedly anchored.

Figure 3:
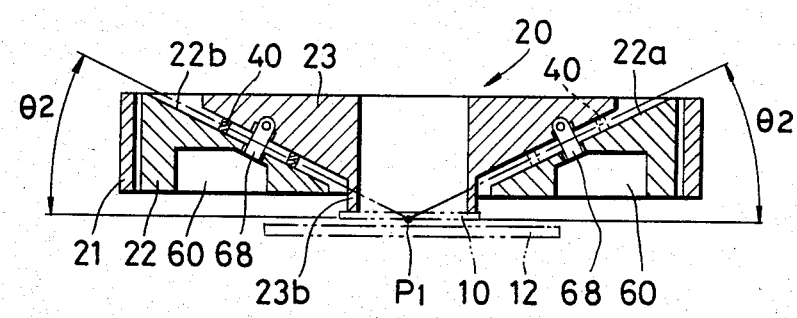
FIG. 3 is a sectional view taken along the line III—III and looking in the direction of arrow in FIG. 2.

Designated by 23 is a second movable stage comprising an upper body portion 23a and a cylindrical lower body portion 23b. The upper portion 23a has inclined surfaces formed on the backside. As shown in FIG. 3, the inclination of the backside surface of the upper portion 23a is substantially the same as that of the upper side inclined surfaces 22a, 22b of the first movable stage 22. The lower cylindrical portion 23b of the second stage is so formed as to be inserted into the central opening $M_2$ of the first stage 22. The cylindrical portion 23b has a sufficient length enough to pass through the table 21 and the first stage 22 and project downwardly beyond the bottom of the table as shown in FIG. 6. The second stage 23 has a bore $M_3$ passing through the upper portion 23a and the lower portion 23b. The center axis of the bore $M_3$ is coincident with the center point P1.

The lower cylindrical portion 23b of the second movable stage 23 functions as a holder for holding a mask or wafer under the action of suction force. In FIGS. 3 and 4, a mask 10 is opposed to a wafer 12. The mask 10 is held by the holder 23b under suction. For exposure, a beam of light or X-rays is projected on the mask and wafer from above through the through-hole $M_3$.

As seen best in FIG. 3, one or two springs 40 are disposed in the space between the inclined surfaces 22a, 22b of the first stage 22 and the correspondingly inclined surfaces of the second stage 23. Both ends of each the spring are fixedly anchored.

Figure 7:
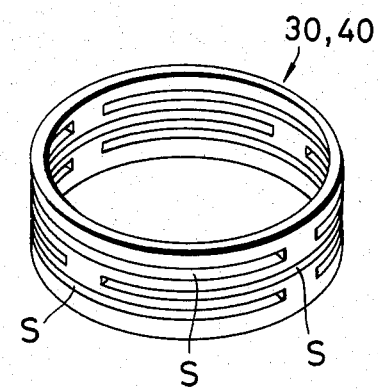
FIG. 7 is a perspective view showing an embodiment of the spring member used in the apparatus.

FIG. 7 shows the detailed form of one of the springs 30, 40.

The spring member 30 (40) is made of a highly elastic material and in the form of a cylinder having slits S formed on the circumferential side wall. The slits are formed by cutting out the side wall in the direction intersecting the center axis substantially at right angles. The slits are alternately shifted as seen in FIG. 7. With this particular structure, the cylindrical spring 30 (40) can be deformed in limited directions only. The directions in which the spring member is deformable are the direction along the axis of the cylinder and the direction intersecting the axis of the cylinder (direction for inclination). The deformation in the second direction is limited only to an amount as determined by the width of the slit S. The cylindrical spring is not deformable in the direction orthogonal to the cylinder axis. In other words, the spring is inhibited from deforming in the direction in which both of the end surfaces of the cylinder move parallel.

The center point P1 of the attitude control apparatus 20 is preset in such manner that when, for example, a mask 10 is held on the holder 23b by suction, the center point P1 just lies on the undersurface of the mask 10 on which a circuit pattern has been formed.

The springs 30 connect the first movable stage 22 with the supporting table 21 in such manner that the backside inclined surfaces of the stage 22 are kept in parallel with the inclined surfaces 21a, 21b of the table 21. Similarly, the springs 40 connect the second movable stage 23 with the first movable stage 22 in such manner that the backside inclined surfaces of the second stage are kept in parallel with the inclined surfaces 22a, 22b on the upper-side of the first stage 22. The positional relationship between the center point P1 and the respective springs 30, 40 is shown in FIG. 2.

In the embodiments, three spring members 30 are disposed between the supporting table 21 and the first stage 22. The centers of the three springs 30 are designated by P31, P32 and P33 of which P31 and P32 are on one side and P33 is on the opposite side. Similarly, three spring members 40 are disposed between the first stage 22 and the second stage 23 with two of the springs being on one side and the remaining one on the opposite side. The centers of the three spring members 40 are designated by P41, P42 and P43. P3 is the middle point between P31 and P32. Let $l_1$ denote the segment binding the middle point P3 to the center point P1 and $l_2$ the segment binding the spring center P33 to the center point P1. Then, the two segments $l_1$ and $l_2$ have the same length. Furthermore, the angles $\theta_1$ which the segments binding P31, P32 and P33 to the center point P1 form with the plane containing the coordinate axes X and Y (reference plane) are all the same (see FIG. 4). P4 is the middle point between the spring centers P41 and P42. Let $l_3$ denote the segment binding P4 to the center point P1 and $l_4$ the segment binding P43 to P1. Then, the two segments $l_3$ and $l_4$ have the same length. Furthermore, the angles $\theta_2$ which the segments binding P41, P42 and P43 to the center point P1 form with the above-mentioned reference plane are all the same (see FIG. 3).

As shown in FIG. 5, the supporting table 21 has two through-holes 51 and 52 formed in the inclined surfaces 21a and 21b respectively. The through-holes 51 and 52 are symmetrically located relative to X—X axis. The first movable stage 22 also has two through-holes 53 and 54 formed in the inclined surfaces 22a and 22b respectively. The through-holes 53 and 54 are symmetrically located relative to Y—Y axis. These through-holes 51, 52, 53, 54 are provided to receive a connecting rod 68 of a driving mechanism as shown in FIG. 8.

Figure 8:
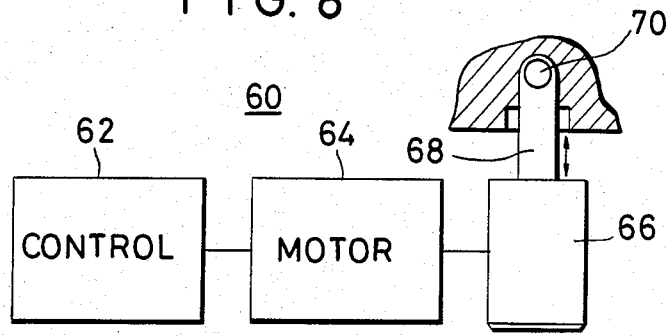
FIG. 8 schematically shows the driving system used for the attitude control.

Referring to FIG. 8 the driving system 60 includes a control unit 62 which may be a microcomputer, a pulse motor 64 and an actuator 66. The pulse motor 64 is controlled by the controller 62. The rotation of the pulse motor is transmitted to the actuator 66 containing a reduction mechanism. The actuator 66 moves the connecting rod 68 forward or backward in the direction of arrow. Two sets of such driving system 60 are provided for driving the first movable stage 22 and further two sets of driving system 60 are provided for the second movable stage 23. Therefore, there are used four sets of driving system 60 in total. Preferably the driving system for the first stage 22 are mounted on the supporting table 21 and the driving systems for the second stage 23 are mounted on the first stage 22. However, it is also possible to mount all of the four driving systems on the supporting table 21. In mounting the driving systems 60, the connecting rods 68 are connected to the stages 22 and 23 by pins 70. It is advisable that the connecting rods be orientated in the direction in which the moving direction of the connecting rods is substantially orthogonal to the segments binding the points P3, P4, P33, P43 to the center point P1. More preferably the connecting rods 68 are connected to the stages 22 and 23 in such manner that the longitudinal axes of the connecting rods pass through the points P3, P4, P33 and P43 respectively.

The manner of operation of the above-shown embodiment is as follows:

When the point P3 of the first movable stage 22 is displaced $+\alpha$ (moved up) and the point P33 is displaced $-\alpha$ (moved down), the stage 22 is inclined $\Delta\theta_1$ rotating about the coordinate axis X. Further, when the point P4 of the second movable stage 23 is displaced $+\beta$ and the point P43 is displaced $-\beta$, the stage 23 is inclined $\Delta\theta_2$ rotating about the coordinate axis Y. Therefore, the inclination of the photo mask held on the holder 23b by suction can be controlled in any direction about the center point P1 by controlling the inclinations of the first and second stages at the same time.

On the other hand, when the points P3 and P33 of the movable stage 22 are displaced $+\alpha$ or $-\alpha$, the stage 22 will be moved upwardly or downwardly in the fashion of parallel displacement. The same is applicable also to the movable stage 23. Therefore, the photo mask can be parallel-moved upwardly or downwardly without any lateral displacement of the center point P1 by displacing the stage 22 and/or the stage 23. In this manner, the attitude of the photo mask can be precisely controlled.

In case that the displacement $\alpha$, $\beta$ is too large, the precise control may be no longer assured. However, so long as the displacement is within the range of several microns to several hundred microns, the attitude control of the mask 10 by inclination and/or parallel displacement can be attained with sufficiently high precision for practical purpose.

As readily understood from the foregoing, the present invention has many advantages over the prior art.

For instance, in the above-described embodiment of the invention the connection points of the connecting rods with the movable stages lie above the plane containing the center point P1, that is, on the side opposite to the wafer. With this arrangement, between the reference plane and the connection positions there is obtained a space available for receiving the driving systems. In practical view this is of great significance. For example, if man wishes to realize the step-and-repeat exposure process employing a proximity exposure apparatus, it is required to move the wafer 12 after every exposure. For this reason, the driving systems necessary for the attitude control of the photo mask 10 can not be projected into the moving area of the wafer. In this case it is a difficult problem to find out the space available for receiving the driving systems. In fact many experts have troubled to solve the problem. On the other hand, there is an increasing demand for smaller exposure apparatus. According to the above-shown embodiment of the invention this problem can very effectively be solved.

While the invention has been particularly shown and described with reference to a preferred embodiment thereof, it is to be understood by those skilled in the art that various modifications can be made therein without departing from the spirit and scope of the invention. As an example, the two spring members 30 at P31 and P32 shown in the embodiment may be replaced by one spring member located at P3. Similarly the spring members 40 at P41 and P42 may be replaced by one spring member 40 located at P4.

We claim:

1. Apparatus for the attitude control of a plate-form body placed on a reference plane comprising:
   (a) support table means;
   (b) at least two first spring members arranged on said support table means at different positions including two positions opposed to each other relative to one of the axes of rectangular coordinates on said reference plane;
   (c) first movable stage means placed on said support table means through said first spring members;
   (d) first driving means for producing a displacement of said first movable stage means at different positions including two positions opposed to each other relative to said one coordinate axis and in the direction tangent to a circle described normally to said one coordinate axis with the center of the circle being on said one coordinates axis;
   (e) at least two second spring members arranged on said first movable stage means at different positions including two positions opposed to each other relative to the other axis of said rectangular coordinates;
   (f) second movable stage means placed on said first movable stage means through said second spring members, said second stage means including means for holding said plate-form body on said reference plane containing the origin of said rectangular coordinates; and
   (g) second driving means for producing a displacement of said second movable stage means at different positions including two opposed positions relative to the other coordinate axis and in the direction tangent to a circle described normally to the other coordinate axis with the center of the circle being on the other coordinate axis.

2. Apparatus according to claim 1, wherein said first driving means includes plural actuator means mounted on said support table means and connected with said first movable stage means, and said second driving means includes plural actuator means mounted on said first movable stage means and connected with said second movable stage means.

3. Apparatus according to claim 1, said first movable stage means is disposed spaced from said support table means and said second movable stage means is disposed spaced from said first movable stage means.

4. Apparatus for the attitude control of a plate-form body placed on a reference plane comprising:
 (a) support table means having a pair of opposed inclined surfaces formed along two different planes containing one of the axes of rectangular coordinates on said reference plane and forming a determined angle with said reference plane;
 (b) a pair of first spring members placed on said pair of inclined surfaces respectively and being deformable in the direction normal to said inclined surfaces;
 (c) first movable stage means having a pair of opposed inclined surfaces formed along two different planes containing the other axis of said rectangular coordinates, said first movable stage means being placed on said support table means through said first spring members;
 (d) a pair of second spring members placed on said pair of inclined surfaces of said first movable stage means respectively and being deformable in the direction normal to said inclined surfaces;
 (e) second movable stage means placed on said first movable stage means through said second spring members, said second movable stage means including means for holding said plate-form body on said reference plane containing the origin of said rectangular coordinates;
 (f) first driving means disposed between the respective inclined surfaces of said support table means and said first movable stage means and including a pair of operation members for displacement in the direction normal to said respective inclined surfaces; and
 (g) second driving means disposed between the respective inclined surfaces of said first movable stage means and said second movable stage means and including a pair of operation members for displacement in the direction normal to said respective inclined surfaces.

5. Apparatus according to claim 4, wherein said pair of operation members of said first driving means are arranged at the same distance from said one coordinate axis and said pair of operation members of said second driving means are arranged at the same distance from said other coordinate axis.

6. Apparatus according to claim 5, wherein each of said first and second driving means includes control means for displacing said pair of operation members in the same amount.

7. Apparatus for the attitude control of a plate-form body placed on a reference plane comprising:
 (a) support table means having a first pair of opposed inclined surfaces formed along two different planes containing one of the axes of rectangular coordinates on said reference plane and forming a determined angle with said reference plane;
 (b) first movable stage means disposed on said first pair of inclined surface with a space between said first stage means and said support table means, said first movable stage means having a second pair of opposed inclined surfaces formed along two different planes containing the other axis of said rectangular coordinates and forming a determined angle with said reference plane;
 (c) second movable stage means disposed on said second pair of inclined surfaces with a space between said first stage means and said second stage means, said second movable stage means including means for holding said plate-form body on said reference plane containing the origin of said rectangular coordinates;
 (d) first limiting means disposed between said first pair of inclined surfaces and said first movable stage means for inhibiting the displacement of said first movable stage means in the direction along said inclined surfaces;
 (e) second limiting means disposed between said second pair of inclined surfaces and said second movable stage means for inhibiting the displacement of said second movable stage means in the direction along said inclined surfaces;
 (f) first driving means including operation members for displacing a plural number of determined positions of said first movable stage means opposed to the respective ones of said first pair of inclined surfaces in the direction normal to said respective inclined surfaces; and
 (g) second driving means including operation members for displacing a plural number of determined positions of said second movable stage means opposed to the respective ones of said second pair of inclined surfaces in the direction normal to said respective inclined surfaces.

8. Apparatus according to claim 7, wherein said first limiting means includes a pair of first spring members disposed on said first pair of inclined surfaces respectively, said first spring members being deformable in the direction normal to said respective inclined surfaces, and said second limiting means includes a pair of second spring members disposed on said second pair of inclined surfaces respectively, said second spring members being deformable in the direction normal to said respective inclined surfaces.

9. In an exposure apparatus for projecting a beam of light on the surface of a semiconductor substrate through a photo mask disposed proximately to said substrate, apparatus for controlling the attitude of the reference plane of said photo mask relative to said substrate surface comprising:
 (a) support table means having a first pair of opposed inclined surfaces formed along two different planes containing one of the axes of the rectangular coordinates on said reference plane and forming a determined angle with said reference plane;
 (b) first movable stage means disposed on said first pair of inclined surfaces with a space between said stage means and said table means, said first movable stage means having a second pair of opposed inclined surfaces formed along two different planes containing the other coordinate axis and forming a determined angle with said reference plane;
 (c) second movable stage means disposed on said second pair of inclined surfaces with a space between said first movable stage means and said second movable stage means, said second movable stage means including means for holding said photo mask on said reference plane containing the origin of said rectangular coordinates;
 (d) first limiting means disposed between said first pair of inclined surfaces and said first movable stage means for inhibiting the displacement of said first stage means in the direction along said first pair of inclined surfaces;

(e) second limiting means disposed between said second pair of inclined surfaces and said second movable stage means for inhibiting the displacement of said second movable stage means in the direction along said second pair of inclined surfaces;

(f) first driving means including a pair of operation members disposed between said first movable stage means and the respective ones of said first pair of inclined surfaces for displacement in the direction normal to said respective inclined surfaces; and (g) second driving means including a pair of operation members disposed between said second movable stage means and the respective ones of said second pair of inclined surfaces for displacement in the direction normal to said respective inclined surfaces.

10. Apparatus according to claim 9, wherein said apparatus further comprises means for projecting the beam of light on a definite area containing the origin of said rectangular coordinates and wherein said support table means and said first and second movable stage means have each a through-hole which said light beam passes through.

* * * * *